US011688752B2

(12) United States Patent
Park

(10) Patent No.: US 11,688,752 B2
(45) Date of Patent: Jun. 27, 2023

(54) IMAGE SENSOR

(71) Applicant: SK hynix Inc., Icheon-si (KR)

(72) Inventor: Tae Gyu Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 198 days.

(21) Appl. No.: 17/023,126

(22) Filed: Sep. 16, 2020

(65) Prior Publication Data

US 2021/0280625 A1 Sep. 9, 2021

(30) Foreign Application Priority Data

Mar. 4, 2020 (KR) ........................ 10-2020-0027089

(51) Int. Cl.
*H01L 27/146* (2006.01)
*H04N 25/76* (2023.01)
*H04N 25/616* (2023.01)

(52) U.S. Cl.
CPC .. *H01L 27/14629* (2013.01); *H01L 27/14621* (2013.01); *H01L 27/14645* (2013.01); *H01L 27/14685* (2013.01); *H01L 27/14627* (2013.01); *H04N 25/616* (2023.01); *H04N 25/76* (2023.01)

(58) Field of Classification Search
None
See application file for complete search history.

(56) References Cited

U.S. PATENT DOCUMENTS

| | | | | |
|---|---|---|---|---|
| 10,811,453 B1* | 10/2020 | Mun | .................... | H01L 27/1464 |
| 2014/0264685 A1* | 9/2014 | Cheng | .................... | H01L 31/18 |
| | | | | 438/69 |
| 2019/0067356 A1* | 2/2019 | Lin | .................... | H01L 27/1463 |
| 2019/0131327 A1* | 5/2019 | Chou | ................ | H01L 27/14629 |
| 2019/0237501 A1* | 8/2019 | Mu | .................... | H01L 27/14685 |
| 2019/0394398 A1* | 12/2019 | Wippermann | ........ | G02B 27/646 |
| 2020/0365636 A1* | 11/2020 | Chen | ................. | H01L 27/14629 |
| 2021/0091127 A1* | 3/2021 | Tsao | .................... | H01L 27/14621 |
| 2021/0193702 A1* | 6/2021 | Zang | .................... | H01L 27/1463 |

FOREIGN PATENT DOCUMENTS

| | | | |
|---|---|---|---|
| JP | 2004193284 A | * | 7/2004 |
| KR | 10-2007-0031717 A | | 3/2007 |
| KR | 10-2018-0016699 A | | 2/2018 |

* cited by examiner

*Primary Examiner* — Ali Naraghi
(74) *Attorney, Agent, or Firm* — Perkins Coie LLP

(57) ABSTRACT

An image sensor including contiguous color filters is disclosed. The image sensor includes a grid disposed between color filters, a first reflective layer disposed over an upper portion of the grid and patterned to include first reflective structures at borders between adjacent sensor pixels to reflect light, and a second reflective layer disposed over and spaced from the first reflective layer and patterned to include second reflective structures at borders between adjacent sensor pixels to reflect light, and each second reflective structure formed in an angular shape to direct reflected light incident to borders between adjacent sensor pixels into adjacent sensor pixels.

18 Claims, 10 Drawing Sheets

IMAGE SENSOR

CROSS-REFERENCE TO RELATED APPLICATION

This patent document claims the priority and benefits of Korean patent application No. 10-2020-0027089, filed on Mar. 4, 2020, the disclosure of which is incorporated herein by reference in its entirety as part of the disclosure of this patent document.

TECHNICAL FIELD

The technology and implementations disclosed in this patent document generally relate to an image sensor including color filters arranged in an array.

BACKGROUND

An image sensor is a device for capturing optical images by converting light into electrical signals using a photosensitive semiconductor material that reacts to light. With the recent development of automotive, medical, computer, and communication industries, the demand for high-performance image sensors is increasing in various devices such as smartphones, digital cameras, game consoles, Internet of Things (IoT), robots, surveillance cameras, medical microcameras, etc.

Image sensors may be broadly classified into a CCD (charge coupled device)-based image sensor and a CMOS (complementary metal oxide semiconductor)-based image sensor. The CCD image sensors offer the best available image quality, but they tend to consume more power and are larger as compared to CMOS image sensors. The CMOS image sensors are smaller in size and consume less power than the CCD image sensors. The CMOS image sensors may be implemented using many different scanning schemes, and because CMOS sensors are fabricated using the CMOS fabrication technology, the CMOS image sensors and other signal processing circuitry can be integrated into a single chip, enabling the production of a small-sized image sensors at a lower cost. For these reasons, the CMOS image sensors are being intensively researched and rapidly coming into widespread use.

SUMMARY

This patent document provides, among others, designs and features of image sensors that can be implemented to reduce or minimize the degradation of light sensitivity caused by a grid structure and to reduce optical crosstalk between color filters.

In an embodiment of the disclosed technology, an image sensor may include an array of sensor pixels to detect incident light to output pixel signals indicative of an image of the incident light, color filters respectively formed over the sensor pixels to filter light incident to the sensor pixels, respectively, a grid disposed between the color filters to form borders between adjacent sensor pixels, a first reflective layer disposed over an upper portion of the grid and patterned to include first reflective structures at borders between adjacent sensor pixels to reflect light, and a second reflective layer disposed over and spaced from the first reflective layer and patterned to include second reflective structures at borders between adjacent sensor pixels to reflect light, and each second reflective structure formed in an angular shape to direct light incident to borders between adjacent sensor pixels into adjacent sensor pixels.

In another embodiment of the disclosed technology, an image sensor may include a first reflective layer disposed over a grid located between a first color filter of a first pixel and a second color filter of a second pixel, and configured to reflect first incident light penetrating the first color filter and second incident light penetrating the second color filter, and a second reflective layer configured to enable the first incident light and the second incident light reflected from the first reflective layer to be respectively reflected to the first color filter and the second color filter, and formed in an angular shape.

In another embodiment of the disclosed technology, an image sensor may include a grid disposed between color filters contiguous to each other, a first reflective layer disposed to cover the grid at an upper portion of the grid, and a second reflective layer disposed over the first reflective layer, and formed in an angular shape.

In another embodiment of the disclosed technology, an image sensor may include a first reflective layer disposed over a grid located between a first color filter of a first pixel and a second color filter of a second pixel, and formed to reflect first incident light penetrating the first color filter and second incident light penetrating the second color filter, and a second reflective layer configured to enable the first incident light and the second incident light reflected from the first reflective layer to be respectively reflected by the first color filter and the second color filter, and formed in an angular shape.

It is to be understood that the foregoing general description, the accompanying drawings, and the following detailed description in this patent document are illustrative and explanatory of technical features and implementations of the disclosed technology.

DETAILED DESCRIPTION

Figure 1:
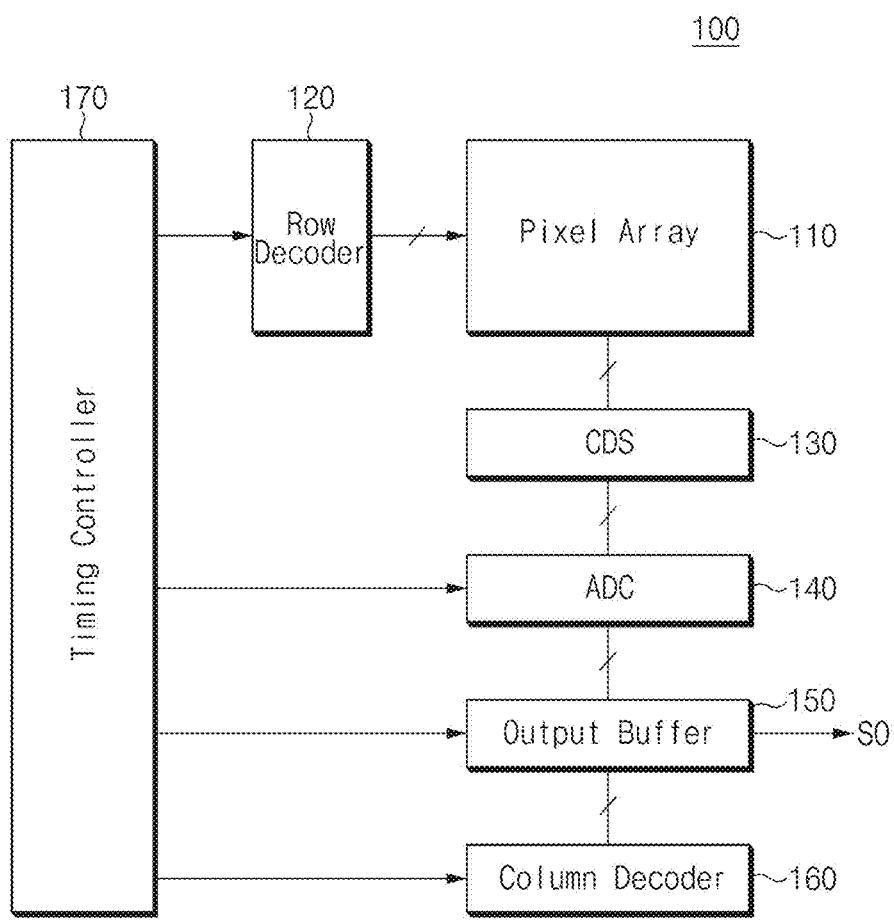
FIG. 1 is a block diagram illustrating an example of an image sensor based on some implementations of the disclosed technology.

This patent document provides implementations and examples of designs and features of an image sensor that can be implemented in ways that improve the optical sensing efficiency and detection sensitivity of the image sensor using additional reflective layers. In some implementations of the disclosed technology, the image sensor may minimize the degradation of light sensitivity caused by a grid structure by reducing crosstalk between color filters. The disclosed technology can be used in some embodiments to implement an image sensor including a first reflective layer and a second reflective layer, as a light guide structure that reflects light incident upon a grid structure and then guides the reflected light into one or more pixels, resulting in improvement in light sensitivity of pixels.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

FIG. 1 is a block diagram illustrating an example of an image sensor 100 based on some implementations of the disclosed technology.

In some implementations such as the example shown in FIG. 1, the image sensor 100 acting as a complementary metal oxide semiconductor (CMOS) image sensor may include a pixel array 110, a row decoder 120, a correlated double sampler (CDS) circuit 130, an analog-to-digital converter (ADC) 140, an output buffer 150, a column decoder 160, and a timing controller 170. In this case, the above-mentioned constituent elements of the image sensor 100 are merely examples, and at least some constituent elements from among the constituent elements may be added to or omitted from the image sensor 100 as necessary.

The pixel array 110 may include a plurality of unit pixels arranged in rows and columns in a two-dimensional (2D) array. In the array of the plurality of unit pixels, each unit pixel or at least two unit pixels may be structured to share at least one element, so that the plurality of unit pixels arranged in units of a shared pixel structure sharing the at least one element can convert an optical signal or incident light into an electrical signal on a share-pixel basis. Although each unit pixel or each shared pixel may correspond to a 3T pixel having 3 transistors per pixel, a 4T pixel having 4 transistors per pixel, or a 5T pixel having 5 transistors per pixel, or each unit pixel may include more than 5 transistors per pixel in certain implementations. The pixel array 110 may receive a control signal that includes a row selection signal, a pixel reset signal, and/or a transmission (Tx) signal from the row decoder 120, and may be operated based on the control signal received from the row decoder 120.

In some implementations, the row decoder 120 may activate the pixel array 110 based on control signals and/or clock signals provided by the timing controller 170. In some implementations, the row decoder 120 may select at least one row from the pixel array 110. The row decoder 120 may generate a row selection signal to select at least one of a plurality of rows. The row decoder 120 may sequentially enable a pixel reset signal for resetting pixels corresponding to at least one selected row, and a transmission (Tx) signal for the selected pixels to transmit electrical signals generated by the pixels. As a result, an analog-type reference signal and an image signal that are generated from each pixel of the selected row may be sequentially transmitted to the CDS circuit 130. In the context of this patent document, the term "pixel signal" can be used to indicate the reference signal and the image signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, The CDS circuit 130 may sequentially sample and hold the reference signal and the image signal that are transferred from the pixel array 110 to each of the plurality of column lines. That is, the CDS circuit 130 may sample and hold voltage levels of the reference signal and the image signal corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC 140 is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may receive the CDS signal for each column from the CDS circuit 130, may convert the received CDS signal into a digital signal, and may thus output the digital signal. In some implementations, the ADC 140 samples an input signal (e.g., pixel signal) multiple times using the reference signal and analog-to-digital convert the sampled input signals by counting the number of clock pulses until crossing points. The ADC 140 may perform counting and calculation operations based on the CDS signal for each column and a ramp signal received from the timing controller 170, such that the ADC 140 may generate digital image data from which noise (e.g., unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In another embodiment, the ADC 140 may include a single global counter, and may convert a CDS signal corresponding to each column into a digital signal using a global code received from the global counter.

The output buffer 150 may receive image data for each column from the ADC 140. In addition, the output buffer 150 may capture the received image data, and may output the captured image data. The output buffer 150 may temporarily store image data that is output from the ADC 140 upon receiving a control signal from the timing controller 170. The output buffer 150 may operate as an interface configured to compensate for data rate difference or transmission (Tx) speed difference between the image sensor 100 and another device coupled to the image sensor 100.

The column decoder 160 may select a column of the output buffer 150 upon receiving a control signal from the timing controller 170, and may sequentially output the image data temporarily stored in the output buffer 150. In some implementations, the column decoder 160 may receive an address signal from the timing controller 170, may generate a column selection signal based on the received address signal, and may select a column of the output buffer 150 to output image data to be output as an output signal SO from the selected column of the output buffer 150.

The timing controller 170 may control the row decoder 120, the ADC 140, the output buffer 150, and the column decoder 160.

The timing controller 170 may transmit a clock signal for operating or synchronizing the constituent elements of the image sensor 100, a control signal for timing control, and address signals needed for selection of a row or column to the row decoder 120, the column decoder 160, the ADC 140, and the output buffer 150. In some implementations, the timing controller 170 may include a logic control circuit, a phase locked loop (PLL) circuit, a timing control circuit, a communication interface circuit, etc.

Figure 2:
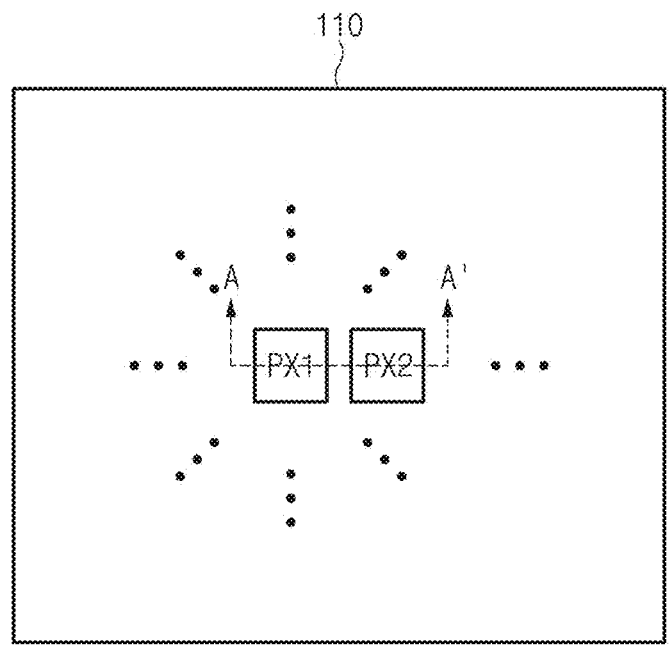
FIG. 2 is a schematic diagram illustrating an example of a pixel array shown in FIG. 1 based on some implementations of the disclosed technology.

FIG. 2 is a schematic diagram illustrating an example of the pixel array 110 shown in FIG. 1 based on some implementations of the disclosed technology.

In some implementations such as the example shown in FIG. 2, the pixel array 110 may include a plurality of unit pixels (PX1, PX2, ...) arranged in a two-dimensional (2D) matrix array including M rows (where 'M' is an integer of 2 or more) and N columns (where 'N' is an integer of 2 or more). In some implementations, the first pixel PX1 and the second pixel PX2 in the pixel array 110 may be arranged to be contiguous (or adjacent) to each other. In other implementations, the first pixel PX1 and the second pixel PX2 may be spaced apart by a predetermined distance. The first pixel PX1 and the second pixel PX2 are discussed as examples of unit pixels contained in the pixel array 110, and it should be noted that other unit pixels are substantially identical in structure to the first pixel PX1 and the second pixel PX2.

Figure 3:
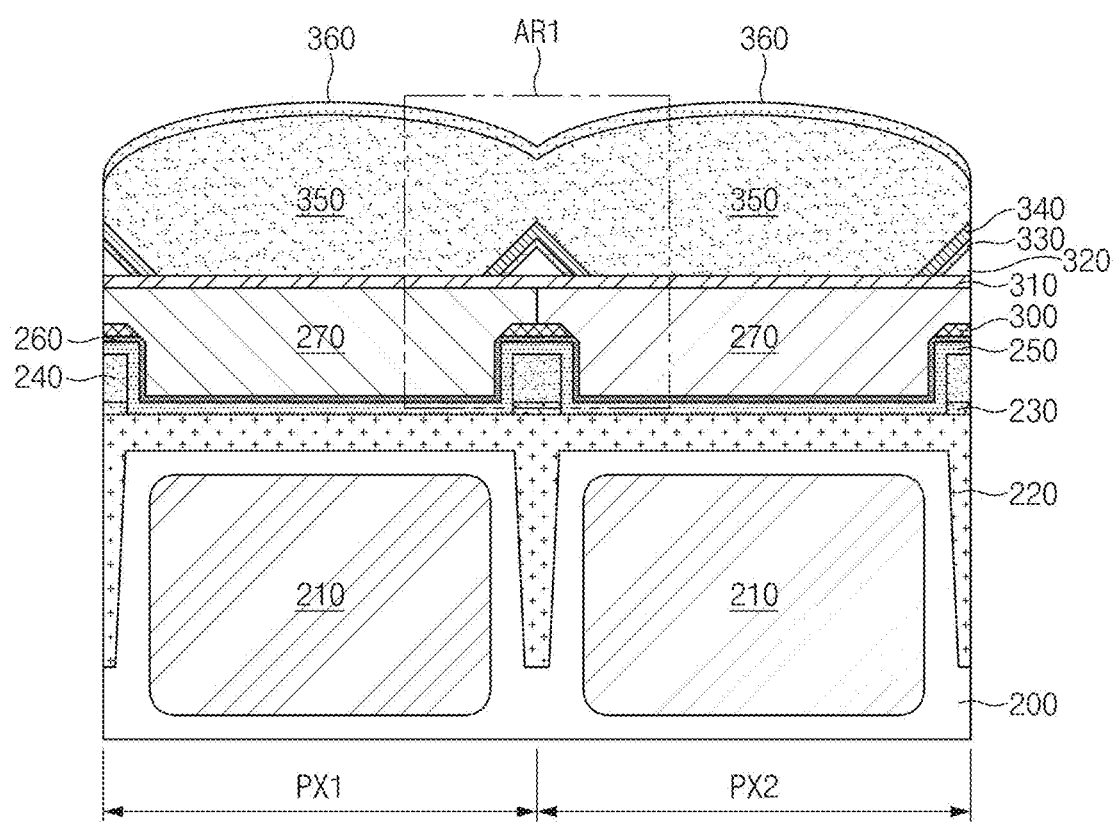
FIG. 3 is a cross-sectional view illustrating an example of unit pixels included in the pixel array shown in FIG. 1 based on some implementations of the disclosed technology.

FIG. 3 illustrates an example of two adjacent unit pixels included in the pixel array 110 shown in FIG. 1 based on some implementations of the disclosed technology. Specifically, FIG. 3 is a cross-sectional view illustrating the first pixel PX1 and the second adjacent pixel PX2 taken along the line A-A' shown in FIG. 2.

In the example shown in FIG. 3, the first pixel PX1 and the second pixel PX2 be formed over or supported by a substrate 200, and each of PX1 and PX2 includes a photoelectric conversion element 210, an insulation layer 220, a first grid 230, a second grid 240, a first buffer layer 250, a second buffer layer 260, a color filter 270, a first reflective layer 300, an over-coating layer 310, an air layer 320, a capping layer 330, a second reflective layer 340, a microlens 350, and an anti-reflection layer 360.

The substrate 200 may include a top surface and a bottom surface. In some implementations, the substrate 200 includes a semiconductor material doped with impurities. For example, the substrate 200 may be a P-type or N-type bulk substrate, may be a P-type bulk substrate in which a P-type or N-type epitaxial layer is grown, or may be an N-type bulk substrate in which a P-type or N-type epitaxial layer is grown.

The photoelectric conversion element 210 may be disposed in a region corresponding to each pixel PX1 or PX2 in the substrate 200. The photoelectric conversion element 210 may generate and accumulate photocharges corresponding to the intensity of incident light in an inner region thereof. The photoelectric conversion element 210 may be arranged to increase a fill factor indicating light reception (Rx) efficiency. For example, the photoelectric conversion element 210 may also be implemented as a photodiode, a phototransistor, a photogate, a pinned photodiode or a combination thereof.

If the photoelectric conversion element 210 is implemented as a photodiode, the photoelectric conversion element 210 may be formed as an N-type doped region through ion implantation of N-type ions. In one embodiment, the photodiode may be formed by stacking a plurality of doped regions on top of one another. In this case, a lower doped region may be formed by implantation of P-type ions and/or $N^+$-type ions, and an upper doped region may be formed by implantation of $N^-$-type ions.

In a process for forming the insulation layer 220, the photoelectric conversion element 210 may be formed in the substrate 200, a deep trench isolation (DTI) structure may be formed through a trench process, and insulation materials may be deposited to fill the gap in an upper portion of the substrate 200 and the DTI structure, resulting in formation of the insulation layer 220. In some implementations, the insulation materials may be formed of transparent insulation materials such as silicon oxide materials. On the other hand, the DTI structure may be formed by etching a substrate or a material layer in the substrate in a vertical direction, so that the DTI structure can electrically or optically isolate neighboring pixels (e.g., PX1 and PX2) from each other.

The second grid 240 may be formed over the first grid 230 arranged between the contiguous color filters 270 to reduce the optical crosstalk between the contiguous color filters 270. Each of the first grid 230 and the second grid 240 may be formed of metal having a high light absorption rate, and the first grid 230 may include materials different from those of the second grid 240. For example, the second grid 240 may include tungsten (W) and the first grid 230 may include titanium nitride (TiN), without being limited thereto.

In the example designs of image sensors disclosed herein, each image sensor, e.g., the sensor example in FIG. 3, may include a grid structure as a grid between the unit pixels included in the pixel array 110 to form borders between adjacent unit pixels included in the pixel array 110. Such a grid structure forms a physical division between adjacent unit pixels to separate adjacent unit pixels. For example, the sensor example in FIG. 3 shows a grid structure that includes the first grid 230, and the second grid 240 and other components such as the first buffer layer 250 and the second buffer layer 260 that are formed to cover the first grid 230 and the second grid 240. In some implementations, different from the sensor example in FIG. 3, the grid structure may be formed without one of the first grid 230 and the second grid 240, so that the resultant grid structure can be a combined structure of the first grid 230, parts of the first buffer layer 250 and the second buffer layer 260, or a combined structure of the second grid 240, parts of the first buffer layer 250 and the second buffer layer 260.

The first buffer layer 250 and the second buffer layer 260 may be sequentially stacked to cover a top surface of the insulation layer 220 and top surfaces of the first grid 230 and the second grid 240. Each of the first buffer layer 250 and the second buffer layer 260 may be formed to extend between the insulation layer 220 and the color filter 270, such that each of the extended first buffer layer 250 and the extended second buffer layer 260 can be disposed below the color filter 270. In addition, the first buffer layer 250 and the second buffer layer 260 disposed below the color filter 270 may be respectively coupled to the first buffer layer 250 and the second buffer layer 260 covering the first grid 230 and the second grid 240 that are disposed between the contiguous color filters 270. That is, the first buffer layer 250 and the second buffer layer 260 covering the first grid 230 and the second grid 240 may be respectively incorporated with the first buffer layer 250 and the second buffer layer 260 disposed below the color filter 270.

Therefore, the first buffer layer 250 and the second buffer layer 260 may be formed to contact the top surface of the insulation layer 220 and large regions of the surfaces of the first grid 230 and the second grid 240, improving the structural stability of the first grid 230 and the second grid 240. In addition, due to a balance of tensile stress generated by the first buffer layer 250 and the second buffer layer 260 disposed below the color filter 270, the first grid 230 and the second grid 240 may maintain their structures and stability even with their narrow widths.

In addition, the first buffer layer 250 and the second buffer layer 260 disposed below the color filter 270 may operate as an anti-reflection layer that compensates for a difference in refractive index between the color filter 270 and the substrate 200 and thus enables light having penetrated the color filter 270 to be effectively incident into the substrate 200.

The first buffer layer 250 may include a silicon nitride film ($Si_xN_y$, where each of 'x' and 'y' is a natural number) or a silicon oxide nitride film ($Si_xO_yN_z$, where each of 'x', 'y', and 'z' is a natural number). The second buffer layer 260 may include an undoped silicate glass (USG) film.

The color filter 270 may include optical filters formed over the substrate 200, and may selectively transmit visible light at a certain wavelength (e.g., red light, green light, blue light, magenta light, yellow light, cyan light, or the like) while blocking light at other wavelength. In some implementations, when each pixel PX1 or PX2 corresponds to a depth pixel, the color filter 270 may be omitted or may be replaced with an infrared (IR) filter. The color filter 270 included in the first pixel PX1 may be defined as a first color filter, and the color filter 270 included in the second pixel PX2 may be defined as a second color filter.

Notably, the sensor example in FIG. 3 includes the first reflective layer 300 which may be in contact with the second buffer layer 260 in a manner that the first reflective layer 300 can cover the second grid 240 while simultaneously being located above the second grid 240. The first reflective layer 300 may include materials (e.g., aluminum (Al) or silver (Ag)) having relatively high light reflectivity. The first reflective layer 300 may be patterned to expose the unit pixels (e.g., PX1 and PX2) and to cover the border regions between adjacent unit pixels so that at least some parts of the first reflective layer 300 may belong to the first pixel PX1 and at least other parts of the first reflective layer 300 may belong to the second pixel PX2.

The over-coating layer 310 may be disposed over the color filters 270, and may prevent the irregular or diffused reflection of incident light, thereby suppressing flare characteristics. In addition, the over-coating layer 310 may compensate for an uneven surface that may be caused by the color filters 270, so that the over-coating layer 310 may allow the microlens 350 to have a constant height.

The air layer (or low index layer) 320 may be disposed over the over-coating layer 310, and the shape of the air layer 320 may be defined by the capping layer 330 (or the second reflective layer 340) and the over-coating layer 310. As can be seen from FIG. 3, the air layer 320 may be formed in a triangular shape. The air layer 320 may be filled with air having a relatively low refractive index (e.g., 1).

In the context of this patent document, the air layer is a specific example of a low-index material layer.

The disclosed technology can be implemented in some embodiments to provide an image sensor that includes patterned reflective layers disposed over the grid structure and formed in angular shapes (e.g., a triangular shape) such that light incident to the regions between unit pixels is reflected from the reflective layers toward adjacent imaging unit pixels, thereby improving the light sensitivity of imaging unit pixels.

The capping layer 330 may be disposed to surround the air layer 320 at an upper portion of the over-coating layer 310. The capping layer 330 together with the over-coating layer 310 may form the shape of the air layer 330. The capping layer 330 may be an ultra low temperature Oxide (ULTO) film such as a silicon oxide ($SiO_2$) film.

The second reflective layer 340 may be formed over the capping layer 330 while surrounding the capping layer 330. The second reflective layer 340 may have substantially the same shape as that of the capping layer 330. The second reflective layer 340 may be formed and patterned in an angular shape that reflects light. The second reflective layer 340 may include materials (e.g., aluminum (Al) or silver (Ag)) having a relatively high light reflectivity.

In some other implementations, the capping layer 330 and the second reflective layer 340 may be located to be interchanged with each other.

The microlens 350 may be formed over the over-coating layer 310 and the second reflective layer 340 to converge incident light to a corresponding color filter, thereby improving the light reception (Rx) efficiency of the photoelectric conversion element 210.

The anti-reflection layer 360 may reduce reflection of light incident onto the microlens 350, such that more light rays can be incident onto the microlens 350. The anti-reflection layer 360 may be formed of a multilayer structure formed by stacking different materials having different refractive indices.

Figure 4:
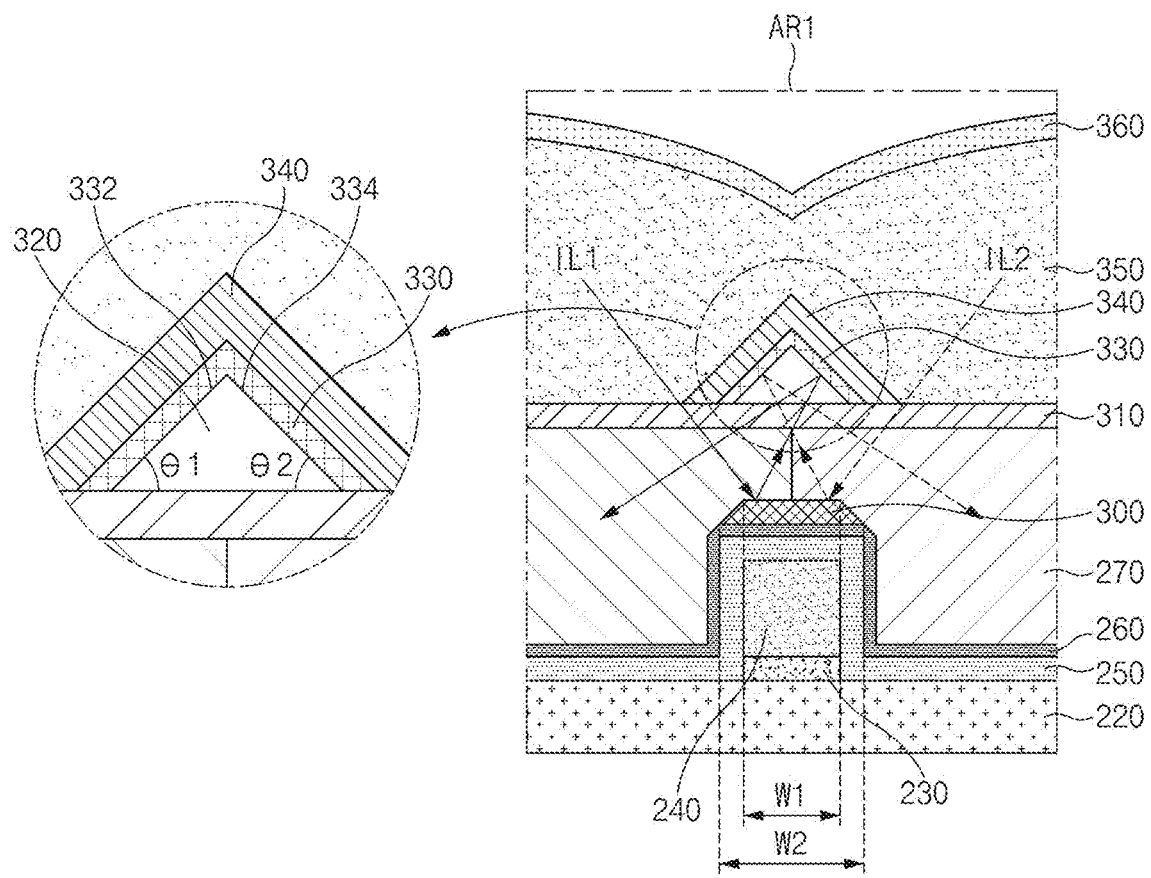
FIG. 4 is an enlarged view illustrating an example of a first region shown in FIG. 3 based on some implementations of the disclosed technology.

FIG. 4 is an enlarged view illustrating an example of a first region shown in FIG. 3 to illustrate the operation of the patterned reflective layers.

In the example in FIG. 4, a first incident light ray IL1 may sequentially pass through the microlens 350, the over-coating layer 310, and the color filter 270, such that the first incident light ray IL1 may be incident upon the first reflective layer 300 formed above the second grid 240. In some embodiments of the disclosed technology, the first reflective layer 300 and the second reflective layer 340 can cause the first incident light ray IL1 to be directed to the photoelectric conversion element 210 through successive reflections at the first reflective layer 300 and the second reflective layer 340. For example, the first incident light ray IL1 reaching the first reflective layer 300 may be reflected in the direction toward the microlens 350. The first incident light ray IL1 that is reflected from the first reflective layer 300 sequentially passes through the color filter 270, the over-coating layer 310, the air layer 320, and the capping layer 330. The first incident light ray IL1 that reaches the second reflective layer 340 may be reflected from the second reflective layer 340 disposed in the microlens 350, and may be guided to the photoelectric conversion element 210 after passing through the first color filter of the first pixel PX1. In addition, due to a difference in refractive indices between the air layer 320 and the capping layer 330, the first incident light ray IL1 may also be reflected from a boundary between the air layer 320 and the capping layer 330, such that the reflected light can be guided to the photoelectric conversion element 210 after passing through the first color filter of the first pixel PX1. Here, the air layer 320 may increase reflectivity of the first incident light ray IL1 because at least some parts of the first incident light ray IL1 can also be absorbed by the second reflective layer 340 formed of high-reflectivity metals.

Likewise, the second incident light ray IL2 may sequentially pass through the microlens 350, the over-coating layer 310, and the color filter 270, and may thus be incident upon the first reflective layer 300 formed above the second grid 240. In some embodiments of the disclosed technology, the first reflective layer 300 and the second reflective layer 340 can also cause the second incident light ray IL2 to be guided to the photoelectric conversion element 210 through successive reflections at the first reflective layer 300 and the second reflective layer 340. The second incident light ray IL2 reaching the first reflective layer 300 may be reflected in the direction toward the microlens 350. The second incident light ray IL2 that is reflected from the first reflective layer 300 sequentially passes through the color filter 270, the over-coating layer 310, the air layer 320, and the capping layer 330. The second incident light ray IL2 that reaches the second reflective layer 340 may be reflected from the second reflective layer 340 disposed in the microlens 350, and may be guided to the photoelectric conversion element 210 after passing through the second color filter of the second pixel PX2. In addition, due to a difference in refractive index between the air layer 320 and the capping layer 330, the second incident light ray IL2 may also be reflected from a boundary surface between the air layer 320 and the capping layer 330, such that the reflected light can be guided to the photoelectric conversion element 210 after passing through the second color filter of the second pixel PX2. Here, the air layer 320 may increase reflectivity of the second incident light ray IL2 because at least some parts of the second incident light ray IL2 can also be absorbed by the second reflective layer 340 formed of high-reflectivity metals.

Assuming that the first reflective layer 300 and the second reflective layer 340 are not disposed in the image sensor 100, the first and second incident light rays IL1 and IL2 may first be incident upon the second buffer layer 260 formed above the second grid 240, and may be reflected outside by passing through the microlens 350 or may be absorbed by the second grid 240. As a result, the amount of light rays incident upon the photoelectric conversion elements 210 of the first pixel PX1 and the second pixel PX2 may be reduced, resulting in reduction in light sensitivity (or light reception (Rx) efficiency) of each pixel.

However, the image sensor 100 based on some implementations of the disclosed technology may include the first reflective layer and the second reflective layer that operate as a light guide structure by reflecting light to be incident upon the grid structure and then guiding the reflected light into each imaging pixel, resulting in improvement in light sensitivity of each pixel.

The first reflective layer 300 may be formed in a shape in which left and right edges are severed. As a result, the first reflective layer 300 has an inclined surface with a predetermined slope, such that the length W1 of a top surface of the first reflective layer 300 is shorter than the length W2 of a bottom surface of the first reflective layer 300. The inclined surface of the first reflective layer 300 may enable light incident upon the grid structure to be directly reflected toward the corresponding pixel, resulting in improvement in light sensitivity (or light reception (Rx) efficiency) of each pixel. In some other implementations, the first reflective layer 300 may be formed without such an inclined surface.

The second reflective layer 340 may be formed in an angular structure by which the first and second incident light rays IL1 and IL2 reflected by the first reflective layer 300 can be reflected back to the corresponding pixel. In more detail, the second reflective layer 340 may include a first surface 332 having a first angle (θ1) with respect to the over-coating layer 310, and a second surface 334 having a second angle (θ2) with respect to the over-coating layer 310. The first surface 332 may enable the second incident light IL2 to be reflected back to the second pixel PX2, and the second surface 334 may enable the first incident light IL1 to be reflected back to the first pixel PX1.

As can be seen from FIG. 4, the first angle (θ1) and the second angle (θ2) are identical to each other, the first reflective layer 300 and the second reflective layer 340 have the same center line, and the first surface 332 and the second surface 334 have the same length. In another example, the first angle (θ1) and the second angle (θ2) may be different from each other, the first reflective layer 300 and the second reflective layer 340 may have different center lines, and the first surface 332 and the second surface 334 may have different lengths. In this case, the center line may refer to a straight line that penetrates a center point between a left end point and a right end point of the first reflective layer 300 or the second reflective layer 340 and at the same time is parallel to a boundary line between contiguous pixels.

Therefore, in the example in FIG. 3, the first reflective layer 300 and the second reflective layer 340 may be patterned to have reflective structures at the borders between adjacent unit pixels and are spaced along the direction perpendicular to the substrate so that reflective structures of the first reflective layer 300 and the second reflective layer 340 at the same border between two adjacent unit pixels can reflect light between them and the angular shape of the reflective structure in the upper second reflective layer 340 causes the reflected light be directed to the photo conversion element in the one of the adjacent unit pixels.

Figure 5:
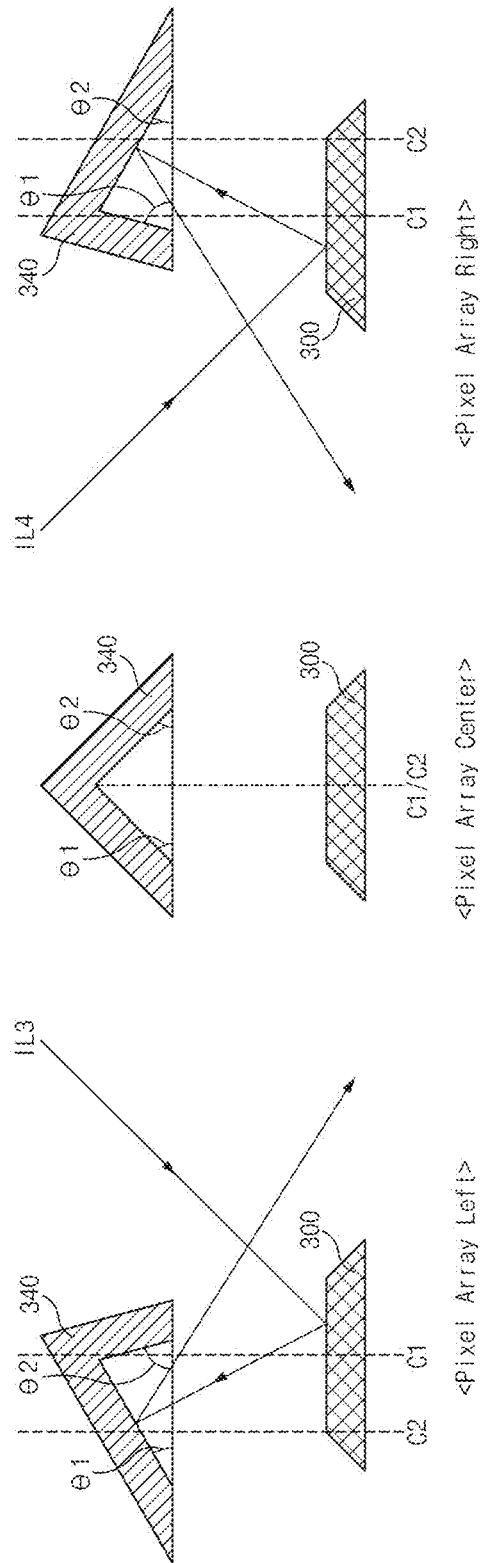
FIG. 5 is a conceptual diagram illustrating different examples of a first reflective layer and a second reflective layer to show how the locations and shapes of the first reflective layer 300 and the second reflective layer 340 can change the reflection of light based on some implementations of the disclosed technology.

FIG. 5 is a conceptual diagram illustrating different examples of reflective structures of the first reflective layer 300 and the second reflective layer 340 to show how the locations and shapes of the first reflective layer 300 and the second reflective layer 340 can change the reflection of light based on some implementations of the disclosed technology. In each of the three examples in FIG. 5, only the reflective structures of the first reflective layer 300 and the second reflective layer 340 at the same border between two adjacent unit pixels are shown to illustrate the light reflection between them for directing the reflected light into one of the two adjacent unit pixels.

In some implementations, the first reflective layer 300 and the second reflective layer 340 are shown in a left edge region of the pixel array 110. In FIG. 5, a region located relatively close to a center point of the pixel array 110 may be defined as a center region, and a region that is located relatively far from the center point of the pixel array 110 and is located closer to upper, lower, left and right edges of the pixel array 110 with respect to the center point of the pixel array 110 may be defined as an edge region.

In the left edge region of the pixel array 110, a chief ray (also called key light) may be identical to third incident light IL3. That is, light incident in the direction from the right pixel to the left pixel with respect to the grid structure including the first reflective layer 300 may have higher intensity (or higher priority). Therefore, in order to allow the third incident light IL3 to be effectively reflected back to the right pixel, the center line of the second reflective layer 340 may be shifted to the left side with respect to the center line of the first reflective layer 300, the first angle (θ1) of the second reflective layer 340 may be smaller than the second angle (θ2) of the second reflective layer 340, and the first surface 332 may be longer in length than the second surface 334.

In addition, the closer the chief ray is to the left edge of the pixel array 110, the greater the angle of incidence of the chief ray. As a result, a spacing (i.e., a distance) between the center line of the first reflective layer 300 and the center line of the second reflective layer 340, a difference between the first angle (θ1) and the second angle (θ2), and a difference in length between the first surface 332 and the second surface 334 may be further increased.

The angle of incidence of the chief ray may be relatively small in the center region of the pixel array 110. That is, light propagating in the direction from one pixel to another pixel with respect to the grid structure including the first reflective layer 300 may not have higher intensity. Therefore, in order to enable light incident upon any one pixel to be effectively reflected back to the one pixel, the center line of the first reflective layer 300 may be identical to the center line of the second reflective layer 340, the first angle (θ1) of the second reflective layer 340 may be identical to the second angle (θ2) of the second reflective layer 340, and the first surface 332 may be identical in length to the second surface 334.

In the right edge region of the pixel array 110, the chief ray may be identical to fourth incident light IL4. That is, light propagating in the direction from the left pixel to the right pixel with respect to the grid structure including the first reflective layer 300 may have higher intensity. Therefore, in order to allow the fourth incident light IL4 to be effectively reflected back to the left pixel, the center line of the second reflective layer 340 may be shifted to the right side with respect to the center line of the first reflective layer 300, the first angle (θ1) of the second reflective layer 340 may be greater than the second angle (θ2) of the second reflective layer 340, and the first surface 332 may be shorter in length than the second surface 334.

In addition, the closer the chief ray is to the right edge of the pixel array 110, the greater the angle of incidence of the chief ray. As a result, a spacing (i.e., a distance) between the center line of the first reflective layer 300 and the center line of the second reflective layer 340, a difference between the first angle (θ1) and the second angle (θ2), and a difference in length between the first surface 332 and the second surface 334 may be further increased.

Although the upper edge region and the lower edge region of the pixel array 110 will herein be omitted for convenience of description, characteristics of the first reflective layer 300 and the second reflective layer 340 in the left and right edge regions of the pixel array 110 can be substantially and equally applied to the upper and lower edge regions of the pixel array 110.

FIGS. 6A to 6E are cross-sectional views illustrating methods for forming one or more unit pixels and the reflective structures based on some implementations of the disclosed technology.

A fabrication process (hereinafter referred to as a second fabrication process for convenience of description) to be performed after formation of the over-coating layer 310 in each of the first pixel PX1 and the second pixel PX2 will hereinafter be described with reference to FIGS. 6A to 6E. A fabrication process (hereinafter referred to as a first fabrication process for convenience of description) to be performed before formation of the over-coating layer 310 in each of the first pixel PX1 and the second pixel PX2 is as follows. In the first fabrication process, the first grid 230 and the second grid 240 may first be formed, and the first buffer layer 250 and the second buffer layer 260 may be sequentially stacked. Subsequently, the first reflective layer 300 may be formed over a top surface of the second buffer layer 260 covering the first grid 230 and the second grid 240, and may be etched in a manner that left and right edges of the first reflective layer 300 can be severed. Thereafter, the color filter 270 and the over-coating layer 310 may be sequentially formed, and may then be planarized.

Figure 6A:
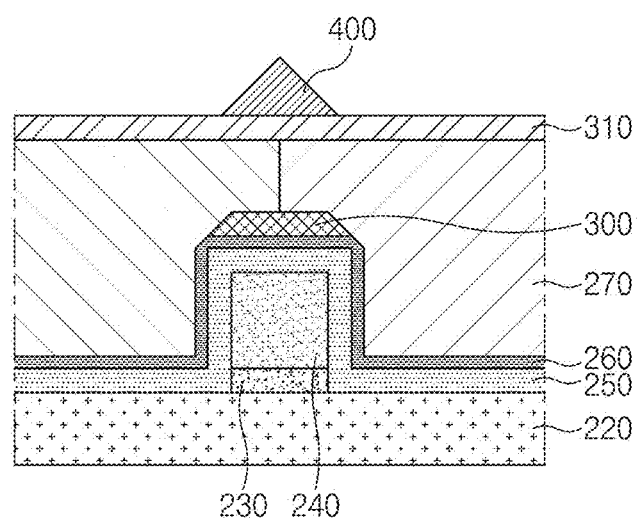
FIGS. 6A to 6E are cross-sectional views illustrating methods for forming one or more unit pixels based on some implementations of the disclosed technology.

In step S10 of FIG. 6A, a sacrificial film 400 may be deposited over the over-coating layer 310. The sacrificial film 400 may include a carbon-containing Spin On Carbon (SOC) film. Thereafter, a first mask pattern defining the air layer 320 may be disposed over the sacrificial film 400. The first mask pattern may have a slope corresponding to the first angle (θ1) and the second angle (θ2) of the air layer 320 (or the second reflective layer 340). The sacrificial film 400 may be etched using the first mask pattern as an etch mask, and the first mask pattern may be removed, such that formation of the sacrificial film 400 corresponding to the shape of the air layer 320 may be completed.

Figure 6B:
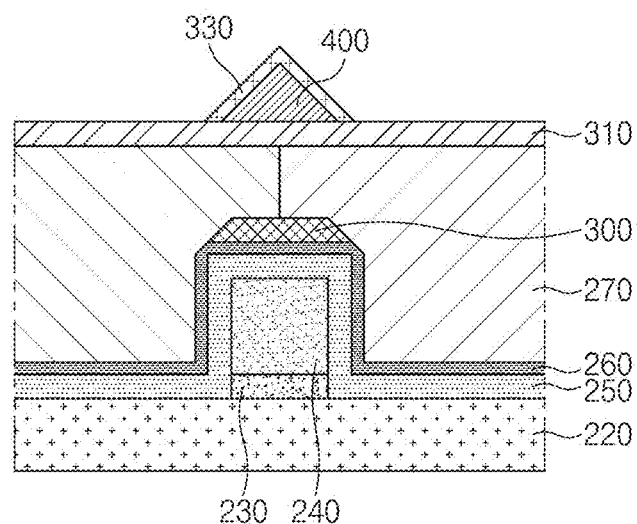

In step S20 of FIG. 6B, capping materials may be deposited over the sacrificial film 400. The capping materials may include an oxide film, for example, a ULTO film. Subsequently, a second mask pattern defining the capping layer 330 may be deposited over the capping materials. The second mask pattern may have a slope corresponding to the first angle (θ1) and the second angle (θ2) of the capping layer 330. The capping materials may be etched using the second mask pattern as an etch mask, and the second mask pattern may be removed, such that formation of the capping layer 330 may be completed. The capping layer 330 may be formed to a predetermined thickness through which molecules formed by combining gas to be used in a subsequent plasma process with carbon of the sacrificial film 400 can be easily discharged outside. Preferably, the capping layer 330 may be formed to a thickness of 300 Å or less.

Figure 6C:
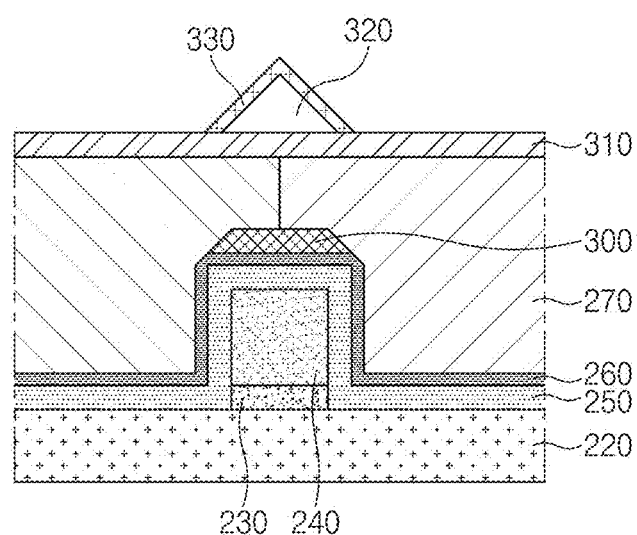

In step S30 of FIG. 6C, after formation of the capping layer 330, the plasma process may be carried out upon the resultant structure, such that the sacrificial film 400 may be removed and the air layer 320 may be formed at the position from which the sacrificial film 400 is removed. In this case, the plasma process may be carried out using gas (e.g., $O_2$, $N_2$, $H_2$, CO, $CO_2$, or $CH_4$) including at least one of oxygen, nitrogen, and hydrogen. In this case, the above-mentioned processes will hereinafter be described using the $O_2$ plasma process as an example. If the $O_2$ plasma process is carried out upon the resultant structure, oxygen radicals (O*) may flow into the sacrificial film 400 through the capping layer 330, and the oxygen radicals (O*) included in the sacrificial film 400 may be combined with carbons of the sacrificial film 400, resulting in formation of CO or $CO_2$. The formed CO or $CO_2$ may be discharged outside through the capping layer 330. As a result, the sacrificial film 400 may be removed, and the air layer 320 may be formed at the position from which the sacrificial film 400 is removed.

Figure 6D:
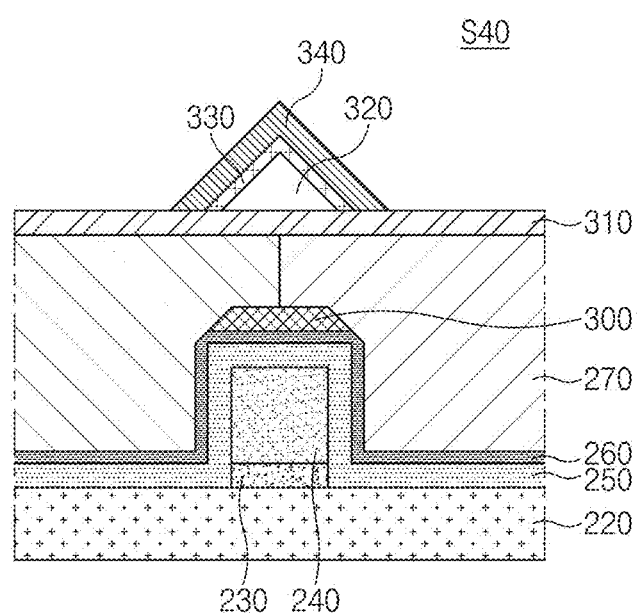

In step S40 of FIG. 6D, reflection materials may be deposited over the over-coating layer 310 and the capping layer 330. The reflection materials may include high-reflectivity metals. Subsequently, a third mask pattern defining the second reflective layer 340 may be disposed over the reflection materials. The third mask pattern may have a slope corresponding to the first angle (θ1) and the second angle (θ2) of the second reflective layer 340 (or the capping layer 330). The reflection materials may be etched using the third mask pattern as an etch mask, and the third mask pattern may be removed, such that formation of the second reflective layer 340 may be completed.

In some other implementations, a method for forming the image sensor in an exemplary case in which the capping layer 330 and the second reflective layer 340 are located to be interchanged with each other will hereinafter be described with reference to the attached drawings.

In a fabrication process corresponding to step S20, the reflection materials may first be deposited over the over-coating layer 310 and the sacrificial film 400. Thereafter, the second mask pattern defining the second reflective layer 340 may be disposed over the reflection materials. The reflection materials may be etched using the second mask pattern as an etch mask, and the second mask pattern may be removed, such that formation of the second reflective layer 340 may be completed. In addition, the second reflective layer 340 may include at least one hole through which molecules formed by combining gas to be used in a subsequent plasma process with carbon of the sacrificial film 400 can be easily discharged outside.

In a fabrication process corresponding to step S30, the capping materials may be deposited over the over-coating layer 310 and the second reflective layer 340. Thereafter, the third mask pattern defining the capping layer 330 may be disposed over the reflection materials. The reflection materials may be etched using the third mask pattern as an etch mask, and the third mask pattern may be removed, such that formation of the capping layer 330 may be completed. The capping layer 330 may be formed to a predetermined thickness through which molecules formed by combining gas to be used in a subsequent plasma process with carbon of the sacrificial film 400 can be easily discharged outside.

In a fabrication process corresponding to step S40, the sacrificial film 400 may be removed by the plasma process, and the air layer 320 may be formed at the position from which the sacrificial film 400 is removed.

Figure 6E:
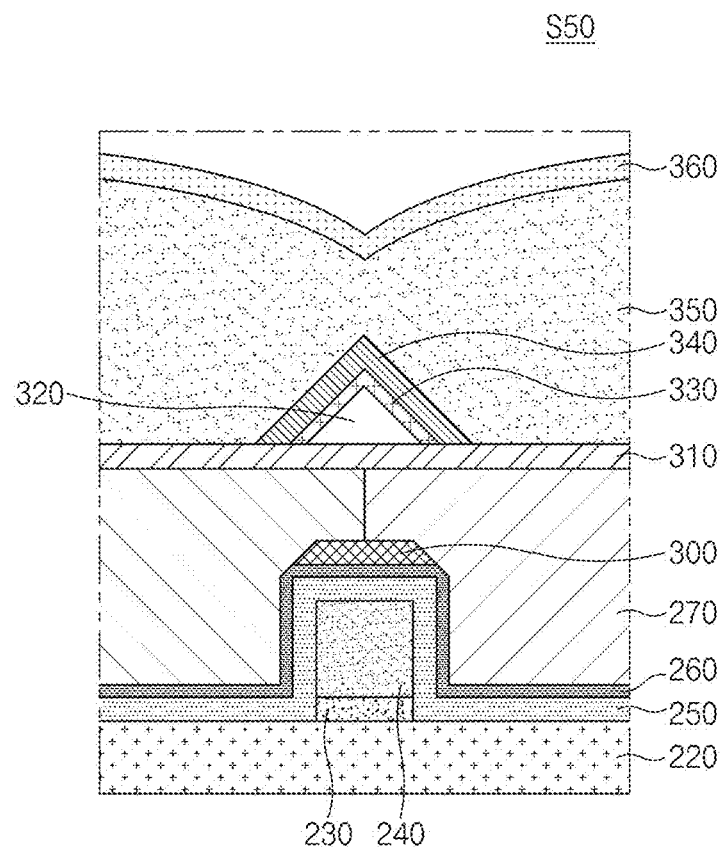

In step S50 of FIG. 6E, the microlens 350 having a constant curvature and the anti-reflection layer 360 may be additionally formed over the over-coating layer 310 and the second reflective layer 340.

In accordance with various embodiments, each (e.g., a module or program) of the above-mentioned constituent elements may include one or more entities. In accordance with various embodiments, at least one constituent element from among the above-mentioned constituent elements or at least one operation may be omitted, or one or more other constituent elements or one or more other operations may be added. Alternatively or additionally, the plurality of constituent elements (e.g., modules or programs) may be integrated into only one constituent element. In this case, the integrated constituent element may perform one or more functions of each of the plurality of constituent elements in the same way as or in a similar way to the previous operation that has been executed by the corresponding constituent element from among the plurality of constituent elements prior to execution of such integration. According to various embodiments, operations performed by a module, a program, or another constituent element may be sequentially, parallelly, repeatedly, or heuristically executed, at least one of the above operations may be executed in different order or omitted, or another operation may be added.

As is apparent from the above description, the image sensor based on some implementations of the disclosed technology includes a first reflective layer and a second reflective layer, each of which acts as a light guide structure that reflects light incident upon the grid structure and then guides the reflected light into one or more pixels, resulting in improvement in light sensitivity of each pixel.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
   an array of sensor pixels to detect incident light to output pixel signals indicative of an image of the incident light;
   color filters respectively formed over the sensor pixels to filter light incident to the sensor pixels, respectively;
   a grid disposed between the color filters to form borders between adjacent sensor pixels;
   a first reflective layer disposed over an upper portion of the grid and patterned to include first reflective structures at borders between adjacent sensor pixels to reflect light; and
   a second reflective layer disposed over and spaced from the first reflective layer and patterned to include second reflective structures at borders between adjacent sensor pixels to reflect light, and each second reflective structure formed in an angular shape to direct light incident to borders between adjacent sensor pixels into adjacent sensor pixels.

2. The image sensor according to claim 1, wherein the angular shape of the second reflective structure is structured to cause light to be guided to a photoelectric conversion element in the image sensor through successive reflections at each first reflective structure in the first reflective layer and a corresponding second reflective structure in the second reflective layer.

3. The image sensor according to claim 1, wherein the grid includes:
   a first grid and a second grid, the first grid including a first material and disposed on the second grid including a second material, the first material being different from the second material.

4. The image sensor according to claim 1, wherein the first reflective structure includes an inclined surface having a predetermined slope.

5. The image sensor according to claim 1, wherein the second reflective layer is disposed between an over-coating layer formed over the color filters and a microlens disposed over the color filters.

6. The image sensor according to claim 5, further comprising:

a low index layer formed in a shape defined by the second reflective layer and the over-coating layer, and including a low index material.

7. The image sensor according to claim 6, wherein the low index material includes air.

8. The image sensor according to claim 1, wherein the second reflective structure includes:
a first surface at a first side formed to have a first angle with respect to an over-coating layer formed over the color filters; and
a second surface at a second side opposite to the first side formed to have a second angle with respect to the over-coating layer.

9. The image sensor according to claim 8, wherein:
the first angle and the second angle are identical to each other.

10. The image sensor according to claim 8, wherein:
a center line of the first reflective structure is identical to a center line of the second reflective structure.

11. The image sensor according to claim 8, wherein:
in a first edge region of the array of sensor pixels at the first side, the first angle is less than the second angle.

12. The image sensor according to claim 8, wherein:
in a first edge region of the array of sensor pixels at the first side, a center line of the first reflective structure is located at the second side with respect to a center line of the second reflective structure.

13. The image sensor according to claim 8, wherein:
in a first edge region of the array of sensor pixels at the first side, the first surface is longer in length than the second surface.

14. The image sensor according to claim 8, wherein:
in a second edge region of the array of sensor pixels at the second side, the second angle is less than the first angle.

15. The image sensor according to claim 8, wherein:
in a second edge region of the array of sensor pixels at the second side, a center line of the first reflective structure is located at the first side with respect to a center line of the second reflective structure.

16. The image sensor according to claim 8, wherein:
in a second edge region of the array of sensor pixels at the second side, the second surface is longer than the first surface.

17. An image sensor comprising:
a first reflective layer disposed over a grid located between a first color filter of a first pixel and a second color filter of a second pixel, and configured to reflect first incident light that has penetrated the first color filter and second incident light that has penetrated the second color filter; and
a second reflective layer configured to enable the first incident light and the second incident light reflected from the first reflective layer to be respectively reflected to the first color filter and the second color filter, and formed in an angular shape.

18. The image sensor according to claim 17, wherein the angular shape is structured to cause the first incident light and the second incident light to be guided to corresponding one or more photoelectric conversion elements in the image sensor through successive reflections at the first reflective layer and the second reflective layer.

* * * * *